United States Patent [19]

Frechette et al.

[11] Patent Number: 4,868,635

[45] Date of Patent: Sep. 19, 1989

[54] LEAD FRAME FOR INTEGRATED CIRCUIT

[75] Inventors: Raymond A. Frechette, North Providence, R.I.; Eugenijus Uzpurvis, North Easton, Mass.

[73] Assignee: Texas Instruments Incorporated, Dallas, Tex.

[21] Appl. No.: 143,550

[22] Filed: Jan. 13, 1988

[51] Int. Cl.$^4$ .............................................. H01L 23/48
[52] U.S. Cl. ......................................... 357/70; 357/68
[58] Field of Search ............................................ 357/70

[56] References Cited

U.S. PATENT DOCUMENTS

| | | | |
|---|---|---|---|
| 4,026,008 | 5/1977 | Drees et al. | 357/70 |
| 4,137,546 | 1/1979 | Frusco | 357/70 |
| 4,410,906 | 10/1983 | Grabbe | 357/70 |
| 4,554,404 | 11/1985 | Gilder, Jr. et al. | 357/70 |
| 4,611,398 | 9/1986 | Eames et al. | 357/70 |

FOREIGN PATENT DOCUMENTS

| | | | |
|---|---|---|---|
| 55-113356 | 9/1980 | Japan | 357/70 |
| 56-164565 | 12/1981 | Japan | 357/70 |
| 0171733 | 9/1985 | Japan | 357/70 |

Primary Examiner—Rolf Hille
Assistant Examiner—Hoanganh Le
Attorney, Agent, or Firm—Joseph E. Rogers; James T. Comfort; Melvin Sharp

[57] ABSTRACT

An integrated circuit lead frame is configured so that it may be die stamped to cut lead frame leads to customize it for a particular semiconductor device bar size. Lead frame leads are cut at a specified distance from the lead frame bar pad so that a semiconductor device bar which is larger than the bar pad may be mounted on the bar pad and cut segments of lead frame leads that are attached to the bar pad.

13 Claims, 8 Drawing Sheets

LEAD FRAME FOR INTEGRATED CIRCUIT

FIELD OF THE INVENTION

This invention relates to packaging of semiconductor devices and more particularly to lead frames upon which semiconductor chips are mounted prior to encapsulation.

DESCRIPTION OF THE PRIOR ART

Most integrated circuit devices are assembled around a lead frame. These lead frames are of various sizes dependent upon the size of the semiconductor chip and the number of connections that have to be made to the semiconductor chip. The lead frames are usually manufactured in long strips of many individual units. The long strips are wide enough to accommodate from one to as many as five lead frames. When a lead frame is more than one lead frame wide, the strip is referred to as a matrix.

A lead frame for a given semiconductor device has its own shape, i.e., its own width and length dependent upon the the size of the semiconductor device. Particularly, the size of the semiconductor bar or chip dictates the size of the bar pad, or area of the lead frame upon which the semiconductor chip is mounted.

Also, the number of leads that need to be connected to the semiconductor chip have to be spaced around the semiconductor chip such that they are of adequate size for attaching to the wire from the chip, and proper spacing has to be between each lead. For this reason some lead frames may have connecting leads on two sides and other lead frames have connecting leads on four sides.

Because of the many sizes of bar pads upon which a semiconductor chip is mounted, there are many different lead frames, and each of these lead frames has to be manufactured and held in inventory by semiconductor manufacturers. Complicated design in lead frames means expensive tooling and results in extra cost and delivery time. It is for this reason that it would be desirable to have one lead frame that can be inexpensively modified to accept a number of different semiconductor chips. One solution to this problem is the use of a lead frame that can be customized after manufacture to be used to accommodate semiconductor chips of different sizes.

SUMMARY OF THE INVENTION

The invention is to a lead frame configuration which allows for customizing of a standard lead frame to different semiconductor bar sizes without cost and lead time problems associated with custom lead frame packages.

The lead frame of the present invention permits "generic" manufacture of lead frames through stamping and plating operations to be held as ready-stock for final configuration requirement, particularly, configured for different bar sizes.

The lead frame has two rails with indexing holes used for feeding the lead frame through various phases of manufacturing of the final semiconductor device, i.e., mounting, wiring and encapsulation. The novel features of the invention applies to lead frames having lead connections to either two or four sides of the semiconductor chip. A bar pad is connected by tie bars to the lead frame rails or to cross members connected to the two rails. There may be either two or four tie bars depending upon the actual lead frame design.

Each lead is initially connected to the bar pad, and the leads are connected together by dam bars. The dam bars are removed after the semiconductor device is connected to the leads. Each lead is made up of two parts, the internal lead, the part of the lead that is enclosed when the device is encapsulated and the external lead that extends out of the encapsulation material. In practicing the invention, the internal leads are cut either at the bar pad or some distance away from the bar pad. When the leads are cut at a distance away from the bar pad, a semiconductor may be allowed to extend out over the cut segments of the leads still attached to the bar pad.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
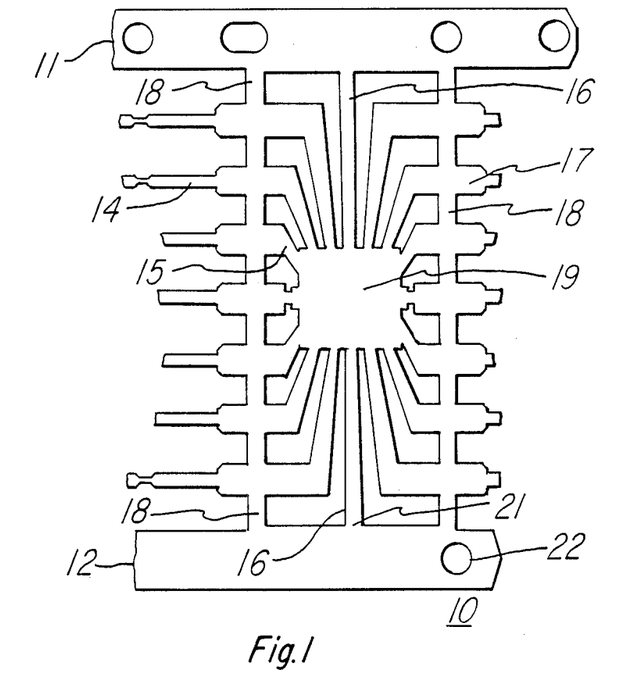
FIG. 1 illustrates a typical lead frame of the prior art.

FIG. 1 illustrates a prior art lead frame. The lead frame 10 is one of many lead frames manufactured in long strips of lead frames, and has two rails, top rail 11 and bottom rail 12. The lead frame is connected to the rails with dam bars 18 and tie bars 16. Each tie bar 16 is scored on the end connected to the rails at 21 to make the tie bars easily removable from the rails.

A bar pad 19 is centrally located on the lead frame, and provides the area on which the semiconductor chip is to be mounted on the lead frame. To provide interconnections to the semiconductor chip after it and a part of the lead frame is encapsulated, the lead frame has internal leads 15 connected to the bar pad, and external leads 14.

The internal leads are connected together by dam bars 18 to stabilize the leads until the lead wire are connected between the semiconductor device and the internal leads. After the lead wires are connected, the dam bars 18 are cut to separate the lead frame leads.

In practice, a semiconductor chip approximately the same size or smaller is mounted on the bar pad such that bond pads on the semiconductor device are close to the lead frame internal leads to minimize the lengths of the lead wires. If a semiconductor chip were much smaller than the bar pad, lead wires of excessive length would have to be used and likely to cause problems. Also, a semiconductor chip larger than the bar pad cannot be used.

Figure 2:
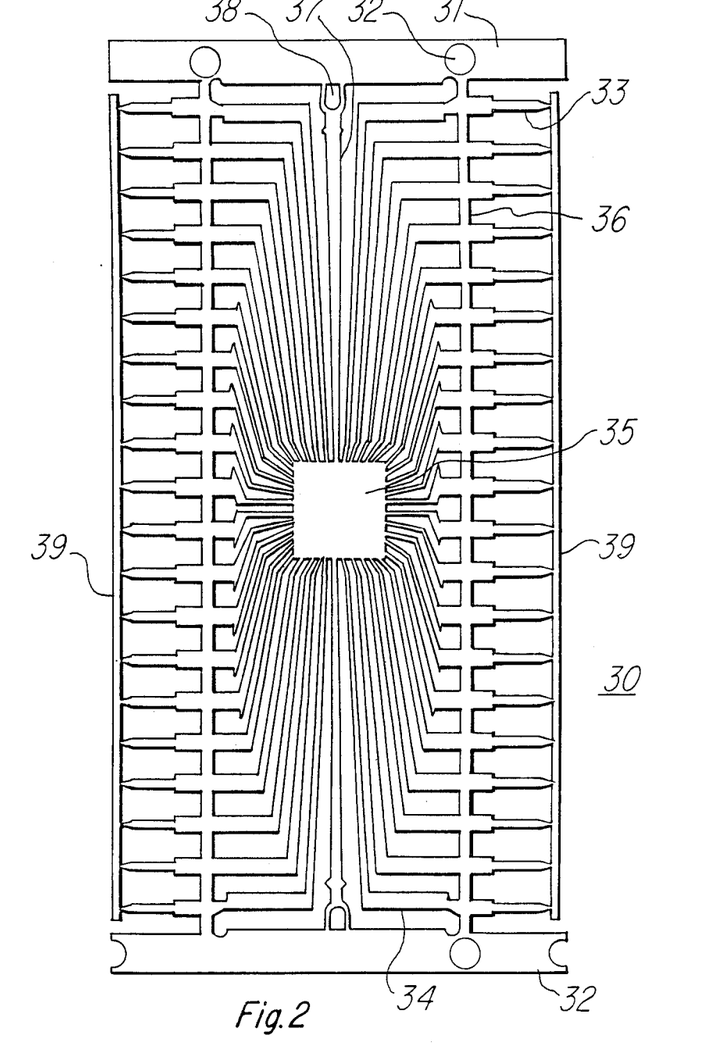
FIG. 2 illustrates a lead frame of the present invention.

FIG. 2 illustrates a lead frame of the present invention that can be adapted to be used with various sizes of semiconductor chips. The lead frame does not have to be modified in any significant way to accommodate semiconductor chips of a size larger than the bar pad.

Lead frame 30 has top and bottom rails 31 and 32. A bar pad 35 is connected between the top and bottoms rails with tie bars 37. Tie bars 37 are connected to the top and bottom rails by a scored or modified region 38 to permit easy separation of the two parts.

A plurality of internal leads 34, are connected between the bar pad 35 and a plurality of external leads 33. The outer ends of lead 33 are connected to side rails 39 to support the leads 33 until all the connections have been made to the leads 33.

Figure 3:
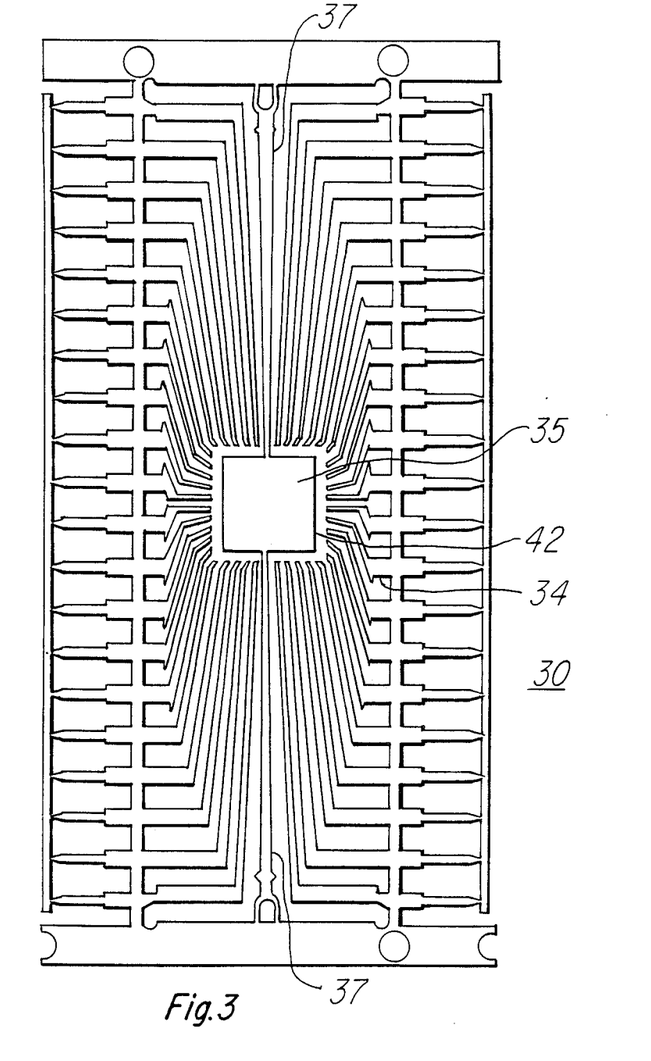
FIG. 3 illustrates a lead frame having the lead fingers cut as in one embodiment of the invention.

FIG. 3 illustrates the lead frame of FIG. 2 with the internal leads separated from the bar pad 35. The internal leads are separated by die stamping the lead frame with a cutting die, such as the one illustrated in FIG. 3a. The die is essentially a square cutting die with two notched areas 44 and 45. These notched areas span the tie bars 37 so as to not cut the tie bars when the internal leads 34 are cut at 42.

Figure 3A:
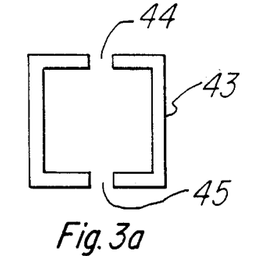
FIG. 3a illustrates the die sized to cut the lead fingers in FIG. 3.

In the lead frame configuration of FIG. 3, and cut with the die illustrated in FIG. 3a, a semiconductor chip of a size slightly smaller than the bar pad may be used. A smaller semiconductor chip may be used by incorporating the invention disclosed and claimed in copending patent application Ser. No. 139,496, filed Dec. 30, 1987, and entitled PATTERNED INTERCONNECT OVERLAY FOR EXTENDING HIGH PIN COUNT LEADFRAME BONDWIRE LENGTHS.

Figure 4:
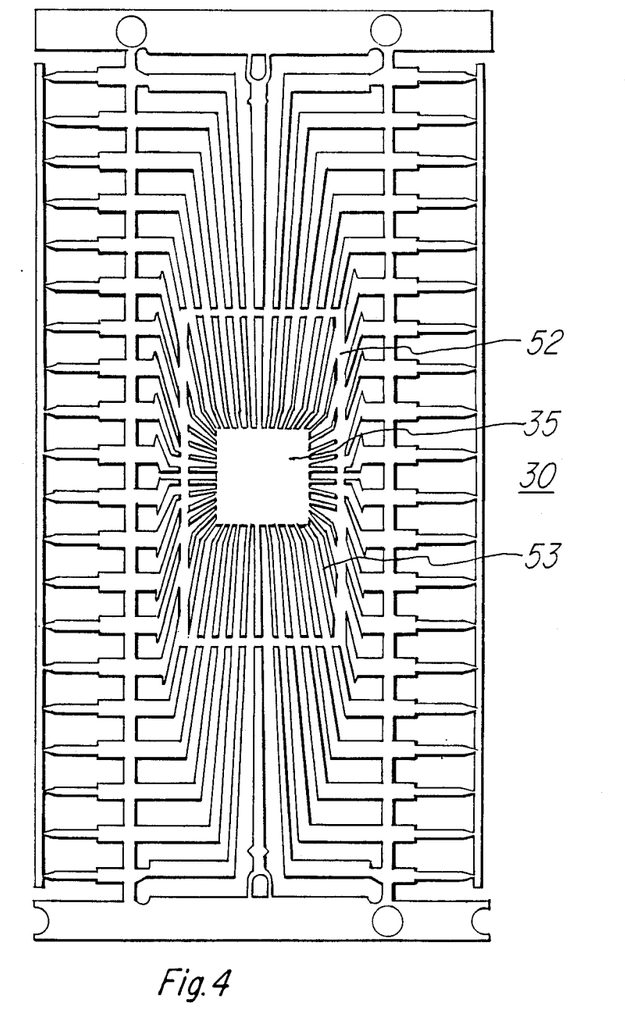
FIG. 4 illustrates a lead frame having the lead fingers cut in another embodiment of the invention.

To use the same lead frame with a semiconductor chip of a size larger than the bar pad, the configuration of FIG. 4 may be used. FIG. 4 illustrates the same lead frame as illustrated in FIGS. 2 and 3, with the following exception. A large die is used to cut the internal leads.

Figure 4A:
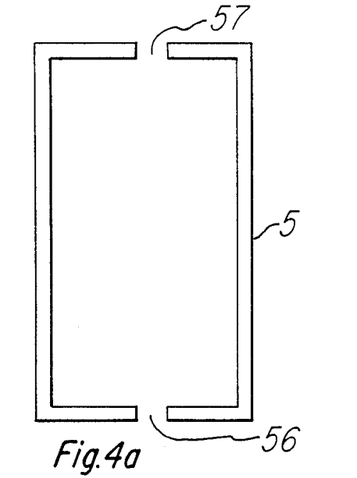
FIG. 4a illustrates a die to cut the lead fingers of FIG. 4.

A cutting die 54 (FIG. 4a) having two notched areas 56 and 57 is used to cut the lead frame internal leads at a greater distant from the bar pad on two sides. The die cut 52 leaves longer internal lead segments 52 attached to the bar pad 35 on two sides of the bar pad. The internal leads attached to the other two sides of the bar pad, if any, are shorter. A longer semiconductor chip may be mounted on the bar pad and allowed to extend over the internal lead segments 52, the internal lead segments 52 supporting the part of the semiconductor chip extending over the lead segments 52.

Figure 5:
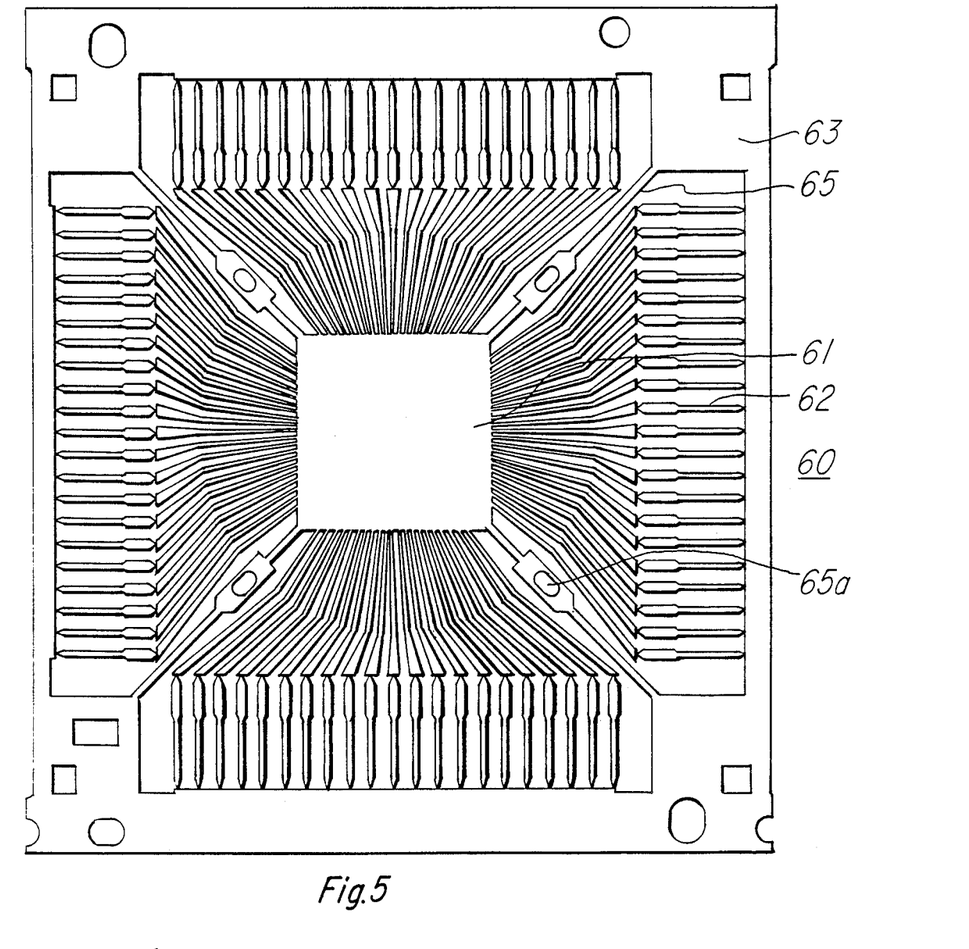
FIG. 5 illustrates another lead frame of the present invention.

FIG. 5 illustrates another lead frame of the present invention that can be adapted to be used with various sizes of semiconductor chips. The lead frame does not have to be modified in any significant way to accommodate semiconductor chips of a size larger than the bar pad.

Lead frame 60 has a frame structure 63 that supports the ends of the lead 62 of the lead frame. A bar pad 61 is connected to the support frame 63 and is connected to the frame structure 63 by tie bars 65. Tie bars 65 include a modified section 65a to permit separation of the two parts. The lead frame leads 62 are connected between the bar pad 61 and the frame structure 63.

Figure 6:
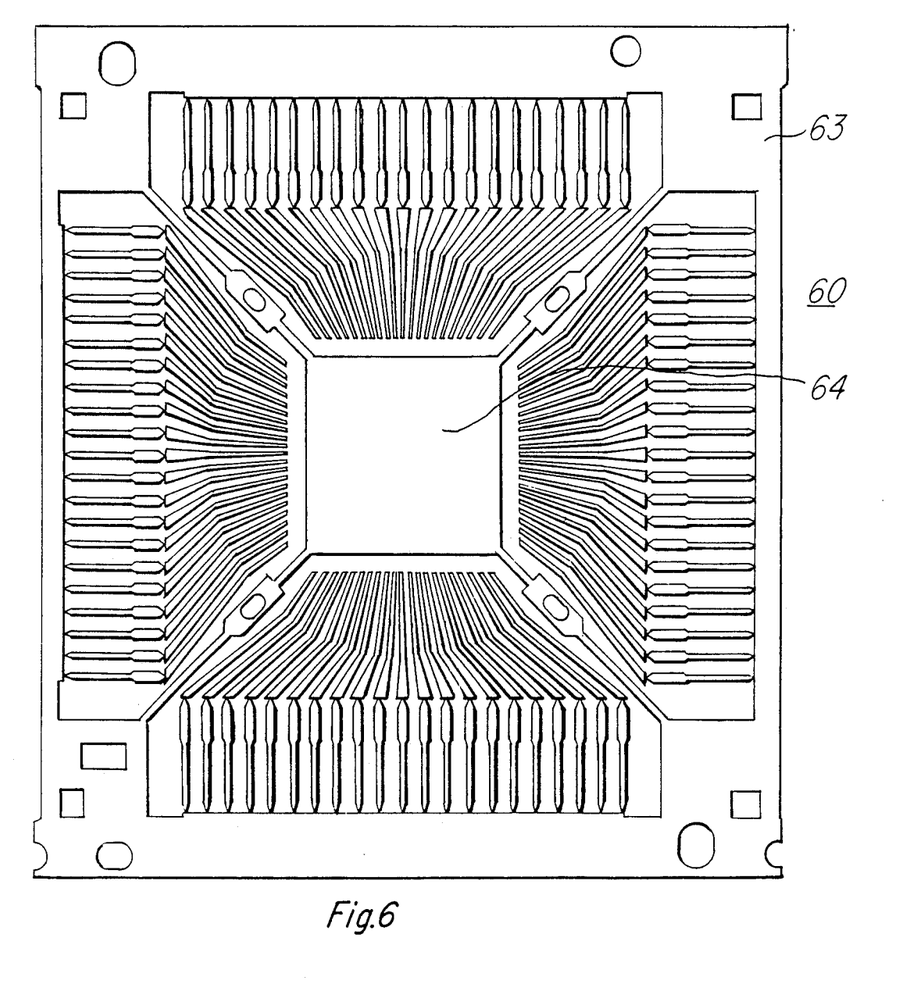
FIG. 6 illustrates a lead frame having the lead fingers cut as in one embodiment of the invention.

FIG. 6 illustrates the lead frame of FIG. 5 with the internal leads separated from the bar pad 64. The internal leads are separated by die stamping the lead frame with a cutting die, such as the one illustrated in FIG. 6a. The die is essentially a square cutting die with four notched areas 68. These notched areas span the tie bars 65 so as to not cut the tie bars when the leads 62 are cut at die cut 64.

Figure 6A:
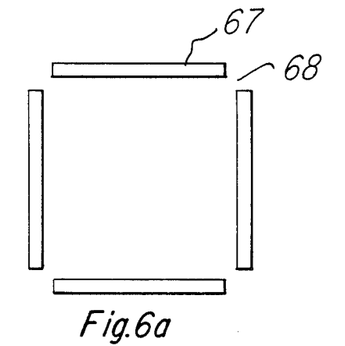
FIG. 6a illustrates the die sized to cut the lead fingers in FIG. 6.

In the lead frame configuration of FIG. 6, and cut with the die illustrated in FIG. 6a, a semiconductor chip of a size slightly smaller than the bar pad may be used. A smaller semiconductor chip may be used by incorporating the invention disclosed and claimed in copending patent application Ser. No. 139,496, filed Dec. 30, 1987, and entitled PATTERNED INTERCONNECT OVERLAY FOR EXTENDING HIGH PIN COUNT LEADFRAME BONDWIRE LENGTHS.

Figure 7:
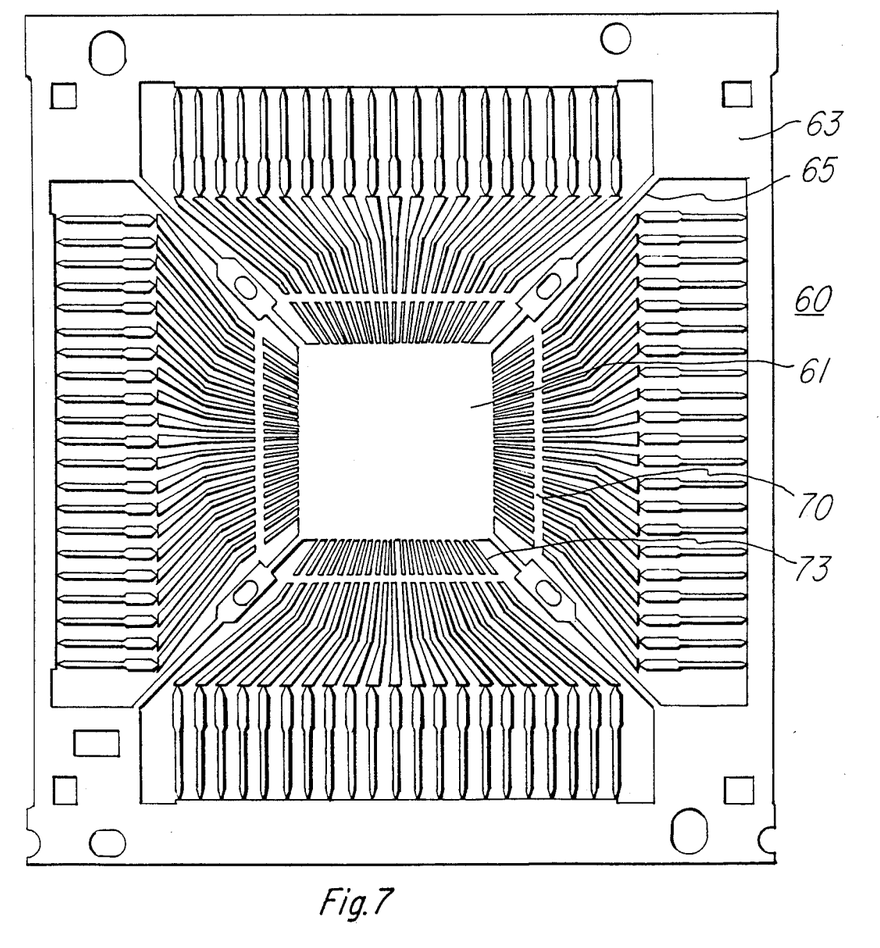
FIG. 7 illustrates a lead frame having the lead fingers cut in another embodiment of the invention.

To use the same lead frame with a semiconductor chip of a size larger than the bar pad, the configuration of FIG. 5 may be used. FIG. 7 illustrates the same lead frame as illustrated in FIGS. 5 and 6, with the following exception. A larger die is used to cut the leads 62 at a distance removed from the bar pad 61.

Figure 7A:
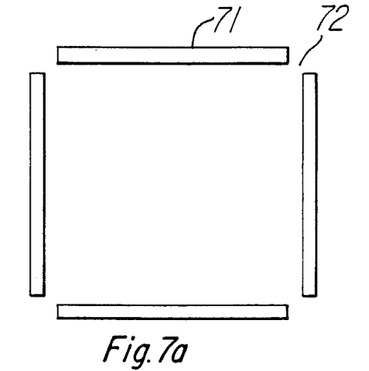
FIG. 7a illustrates a die to cut the lead fingers of FIG. 7.

A cutting die 71 (FIG. 7a) having four notches 72 is used to cut the lead frame internal leads at a greater distant from the bar pad. The four notches 72 prevent the bar ties 65 from being cut. The die cut 70 leaves longer lead segments 73 attached to the bar pad 61 on all four sides of the bar pad 61. A larger semiconductor chip may be mounted on the bar pad and allowed to extend over the internal lead segments 73, the internal lead segments 73 supporting the part of the semiconductor chip extending over the lead segments 73.

The use of the present invention permits the the use of one or two different lead frame configurations to accommodate various size semiconductor chips thereby reducing the number of different sizes of lead frames need for a variety of semiconductor chip sizes.

What is claimed:

1. A lead frame structure for mounting semiconductor devices comprising:
    a lead frame support structure;
    a semiconductor bar pad forming a mounting surface for a semiconductor device;
    a plurality of leads connected between said lead frame support structure and said semiconductor bar pad, and integral therewith, and arrayed along at least two sides of the semiconductor bar pad;
    a die cut separating said plurality of leads into two parts, one part adjacent to and attached to the semiconductor bar pad, such that the size of the bar pad mounting surface is enlarged by the plurality of lead parts attached to the bar pad.

2. The lead frame structure according to claim 1, wherein said die cut leaves lead frame lead segments extending radially from the semiconductor bar pad.

3. The lead frame structure according to claim 2, in combination with a semiconductor device, the semiconductor device being mounted on the semiconductor bar pad and extending out over said radially extending lead segments.

4. The lead frame structure according to claim 1, including scored tie bars connecting the semiconductor bar pad to the lead frame support structure.

5. The lead frame according to claim 1, wherein lead frame leads extend to two sides of the lead frame.

6. The lead frame according to claim 1, wherein lead frame leads extend to four sides of the lead frame.

7. The lead frame structure according to claim 1, wherein lead frame leads extend essentially radially from the semiconductor bar pad, but extend to only two sides of the lead frame.

8. The lead frame structure according to claim 1, wherein lead frame leads extend essentially radially from the semiconductor bar pad, and extend to four sides of the lead frame.

9. A lead frame structure for mounting semiconductor devices comprising:
   a lead frame support structure;
   a semiconductor bar pad forming a mounting surface for a semiconductor device;
   a plurality of leads connected between said lead frame support structure and said semiconductor bar pad, and integral therewith, and arrayed along at least two sides of the semiconductor bar pad;
   a die cut separating said plurality of leads into two parts on two sides of said bar pad, one part adjacent to and attached to the semiconductor bar pad, such that the size of the bar pad mounting surface is enlarged on two sides by the plurality of lead parts attached to the bar pad.

10. The lead frame structure according to claim 9, wherein said lead frame segment lengths depending upon the dimension of the a semiconductor device to be mounted thereupon.

11. The semiconductor lead frame structure according to claim 9, wherein the lead frame leads extend from four sides of the semiconductor bar pad are separated into two segments, one segment attached to the bar pad enlarging the semiconductor mounting area.

12. A lead frame structure for mounting semiconductor devices comprising:
   a lead frame support structure;
   a semiconductor bar pad forming a mounting surface for a semiconductor device;
   a plurality of leads connected between said lead frame support structure and said semiconductor bar pad, and integral therewith, and arrayed along at least two sides of the semiconductor bar pad;
   said lead being in two segments, a first segment adjacent to and connected to the bar pad enlarging the mounting surface of the bar pad, and a second segment of the lead being attached to the lead frame.

13. The lead frame structure according to claim 12, wherein the cut lead frame lead segments attached to the bar pad extend out essentially radially and present an enlarged semiconductor mounting area.

* * * * *